United States Patent
Kiersh et al.

(10) Patent No.: US 6,441,318 B1
(45) Date of Patent: Aug. 27, 2002

(54) COMPENSATION ADJUSTABLE PRINTED CIRCUIT BOARD

(75) Inventors: Jeff S. Kiersh, Annandale; Frank P. Baker, III, Chatham, both of NJ (US)

(73) Assignee: Avaya Technologies Corp., Basking Ridge, NJ (US)

( * ) Notice: Subject to any disclaimer, the term of this patent is extended or adjusted under 35 U.S.C. 154(b) by 0 days.

(21) Appl. No.: 09/642,665

(22) Filed: Aug. 22, 2000

(51) Int. Cl.[7] ............... H01R 12/04; H05K 1/11
(52) U.S. Cl. .................... 174/261; 174/117 F
(58) Field of Search ............... 174/261, 117 F, 174/117 FF; 361/816, 817, 818

(56) References Cited

U.S. PATENT DOCUMENTS

| | | | | |
|---|---|---|---|---|
| 4,362,899 A | * | 12/1982 | Borrill | 174/36 |
| 5,418,329 A | * | 5/1995 | Katoh et al. | 174/52.3 |
| 6,229,095 B1 | * | 5/2001 | Kobayashi | 174/255 |

* cited by examiner

*Primary Examiner*—Jeffrey Gaffin
*Assistant Examiner*—Jeremy Norris
(74) *Attorney, Agent, or Firm*—Dickstein Shapiro Morin & Oshinsky LLP

(57) ABSTRACT

A printed circuit board which is easily compensation adjustable. The PCB has compensator traces which are directly above and parallel to each other. Each of the layers of the PCB contains compensator traces which are aligned in a plane such that each of the compensating traces are aligned in a direction that is perpendicular to the respective planes. Thus, compensation can be effected in each of the various layers of the PCB by drilling one hole for each of the layers since the compensation traces are vertically aligned.

27 Claims, 4 Drawing Sheets

COMPENSATION ADJUSTABLE PRINTED CIRCUIT BOARD

FIELD OF THE INVENTION

This invention relates to a multilayer printed circuit board (PCB) and, more specifically, to PCBs that are easily compensation adjustable.

DISCUSSION OF THE RELATED ART

Telecommunications and data transmissions systems are operating at higher and higher frequencies due to the huge increases in signaling traffic. Although known cables and wiring can, theoretically, handle such increased frequencies, one of the problems encountered is an increase in cross-talk as frequency of transmission is increased. At frequencies above, for example, one megahertz (1 MHz), the degradation of signals due to cross-talk becomes significant. One source of cross-talk is the electromagnetic radiation from the wire pairs in, for example, a transmission cable which induces unwanted signals, i.e., cross-talk, in adjacent pairs. The induced signals materially decrease signal-to-noise ratios and result in increased error rate in data transmission. Various arrangements have been used for reducing cross-talk in cables, such as shielding individual pairs, helically winding twisted pairs, or, where possible, increasing the physical separation of one pair from another.

Cross-talk also occurs in the station hardware, e.g. connectors, line terminals, splitters, cable or cables, etc. The design of station hardware, and more particularly, the connectors therefor should include provisions for reducing cross-talk within the connectors themselves or for counteracting or canceling the cross-talk which is an inevitable product of most such connectors. The plugs and jacks that are commonly used in telecommunications equipment generally include up to eight wires (four pairs) that are necessarily oriented both parallel and close together, a condition that leads to excessive cross-talk at high frequencies.

Cross-talk in the connector is typically reduced or compensated by what are known as compensating traces. By drilling holes and adjusting the sizes of the compensation traces on the PCB, cross-talk can be compensated to a desired amount. Increasing the hole size decreases the amount of compensation of the PCB. This is possible since compensation is roughly related to the surface area of the compensating traces. Typically, multilayer PCBs have compensation traces which are randomly placed from layer to layer. Hence, to adjust the compensation of the board, many different holes may be drilled into the board. Consequently, the desired compensation is not easily obtained without damaging various components on the board (e.g. circuit traces). Hence, it is desirable to form a PCB which is easily compensation adjustable and not subject to damage by numerous drilled holes.

SUMMARY OF THE INVENTION

The present invention relates to a printed circuit board which is easily compensation adjustable. The invention provides a PCB having compensator traces which are directly above and parallel to each other. The PCB layers contain compensator traces which are aligned in planes such that the compensator traces are vertically or directly above and/or below each other. In other words, the compensating traces are aligned in a direction that is perpendicular to the respective planes. Thus, compensation can be effected in each of the various layers of the PCB by drilling one hole for each of the layers since the compensation traces are vertically aligned.

The above advantages and features of the invention will be more clearly understood from the following detailed description which is provided in connection with the accompanying drawings.

DETAILED DESCRIPTION OF PREFERRED EMBODIMENTS

Figure 1:
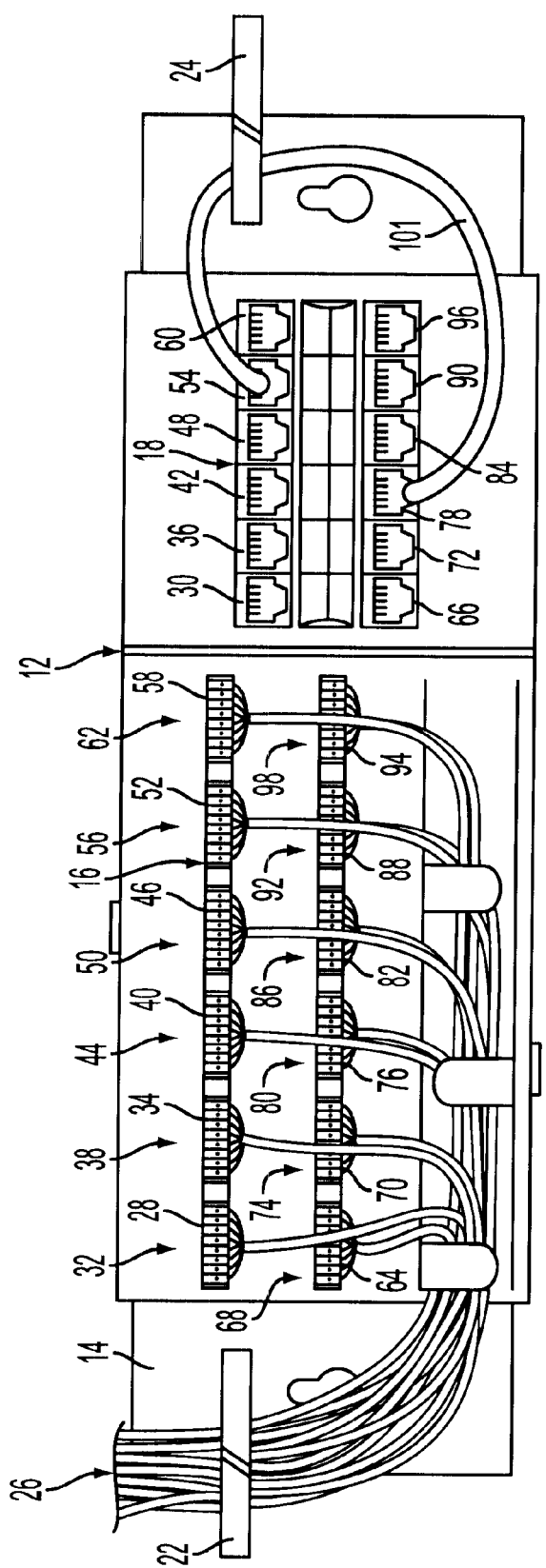
FIG. 1 is a plan view of a patch panel including a circuit board constructed in accordance with the present invention.

The present invention will be described as set forth in FIGS. 1–4. Other embodiments may be utilized and structural or logical changes may be made without departing from the spirit or scope of the present invention. Although a two insulative layer PCB is described in detail herein, the invention is also applicable to PCBs that have more than two layers. Like items are referred to by like reference numerals throughout the drawings.

Figure 2:
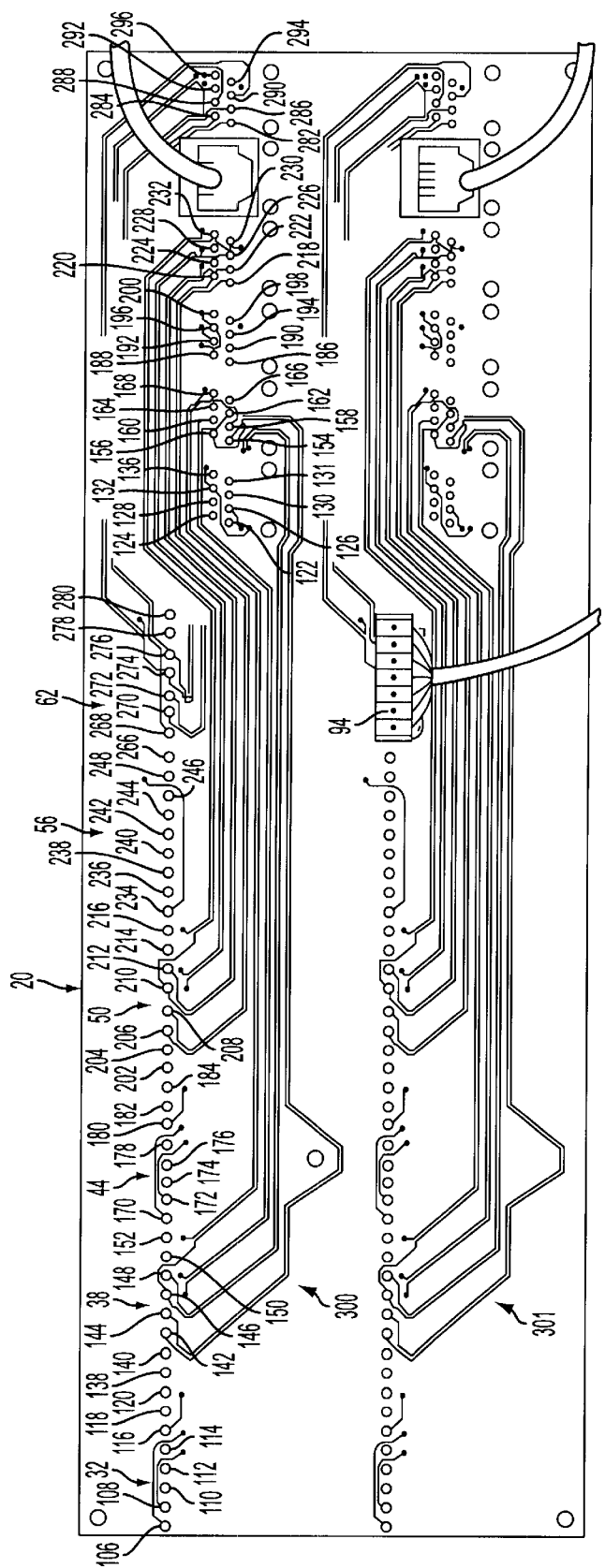
FIG. 2 is a plan view of a top layer of the circuit board of FIG. 1, showing compensating traces constructed in accordance with the present invention along with some of the connectors, jacks, wires, etc., for the sake of clarity of illustration.

Referring now to the drawings, FIG. 1 illustrates a patch panel 12 including a mounting plate 14 with a connector block assembly 16 adjacent to one end and a jack assembly 18 adjacent to the other end. The connector block assembly 16 is connected to the jack assembly 18 through a printed circuit board 20 (FIG. 2). The PCB 20 is hidden from view in FIG. 1 by the connector block and jack assemblies 16, 18.

In FIG. 1, a cable split ring 22 is mounted on the end of the plate 14 adjacent to connector assembly 16 and a patch cord split ring 24 is mounted on the plate adjacent to jack assembly 18. Cables 26 are held in split ring 22. Each of the cables 26 has a plurality of wires which are connected to the connector block assembly 16.

Also, in FIG. 1, a connection patch cord 101 has one end connected to jack 54 and the other end connected to jack 78. As is conventional, the end in jack 78 may be plugged into another selected jack or the end in jack 54 may be plugged into another jack.

Conventional punch down connector blocks make up the connector block assembly 16. The connector blocks 16 are each connected to a desired jack of jack assembly 18 through the circuit board 20 to make up individual ports. In this instance, the jacks are well known, position modular jacks, though other jacks may be used. Connector block 28 is connected to jack 30 to make up a port 32. Connector block 34 is connected to jack 36 to make up a port 38. Connector block 40 is connected to jack 42 to make up port 44. Connector block 46 is connected to jack 48 to make up port 50. Connector block 52 is connected to jack 54 to make up port 56. Connector block 58 is connected to jack 60 to make up port 62. Connector block 64 is connected to jack 66 to make up port 68. Connector block 70 is connected to jack 72 to make up port 74. Connector block 76 is connected to jack 78 to make up port 80. Connector block 82 is connected to jack 84 to make up port 86. Connector block 88 is connected to jack 90 to make up port 92. Connector block 94 is connected to jack 96 to make up port 98. Although a specific connector arrangement is illustrated herein for the sake of explaining the invention, the invention should not be limited to the details of the illustrated embodiments.

Figure 3:
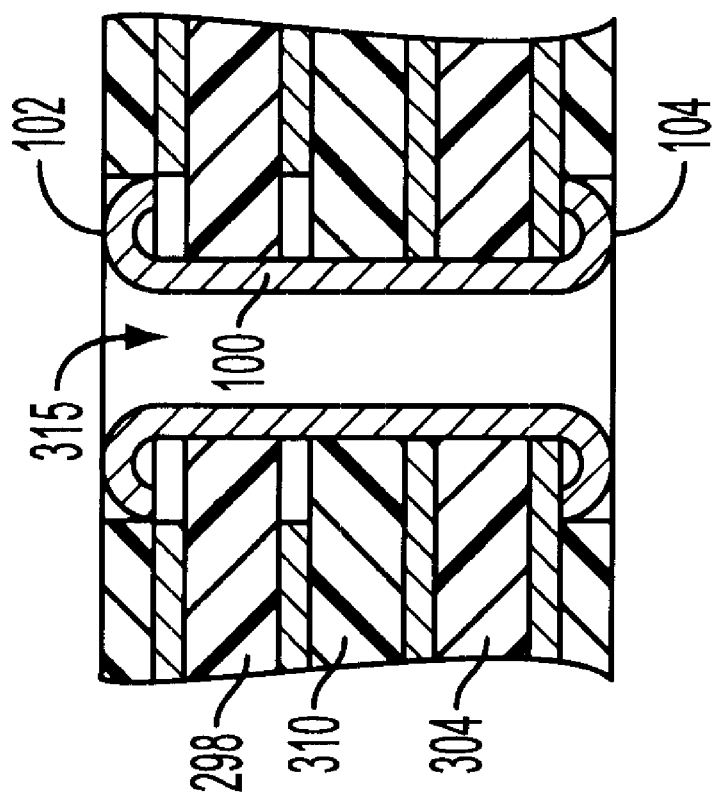
FIG. 3 is a cross sectional view, taken along line 3—3 of FIG. 2, of a plated through hole.

Each of the ports 32, 38, etc. have eight connector plated-through holes to which is connected a respective punch connector block. Each port also has eight jack plated though holes to which is connected the respective jack. A typical connector through hole is shown in FIG. 3. The through hole 315 includes a metal plated main body 100 with opposed pads 102 and 104 at opposite ends. Traces (not shown in FIG. 3) may be connected to the main body 100 to interconnect traces on different levels 298, 310, 304.

As shown in FIG. 2, port 32 includes eight identical connector plated-through holes 106, 108, 110, 112, 114. 116, 118, 120. The connector plated-through holes are connected to the jack plated-through holes 122, 124, 126, 128, 130, 132, 134, 136. Port 38 includes eight connector plated-through holes 138, 140, 142, 144, 146, 148, 150, 152. Port 38 also has eight corresponding jack plated-through holes 154, 156, 158, 160,162,164,166,168.

Port 44 includes connector plated-through holes 170, 172, 174, 176, 178, 180, 182, 184. Port 44 also includes jack plated-through holes 186, 188, 190, 192, 194, 196, 198, 200. Port 50 includes eight connector plated-through holes 202, 204, 206, 208, 210, 212, 214, 216, which are connected to eight jack plated-through holes 218, 220, 222, 224, 226, 228, 230, 232. Port 56 includes eight connector plated-through holes 234, 236, 238, 240, 242, 244, 246, 248 and eight jack plated-through holes 250, 252, 254, 256, 258, 260, 262, 264 (covered by connector patch cord 101 of FIG. 1). Port 62 includes eight connector plated-through holes 266, 268, 270, 272, 274, 276, 278, 280 are connected to eight jack plated-through holes 282, 284, 286, 288, 290, 292, 294, 296, respectively.

Figure 4:
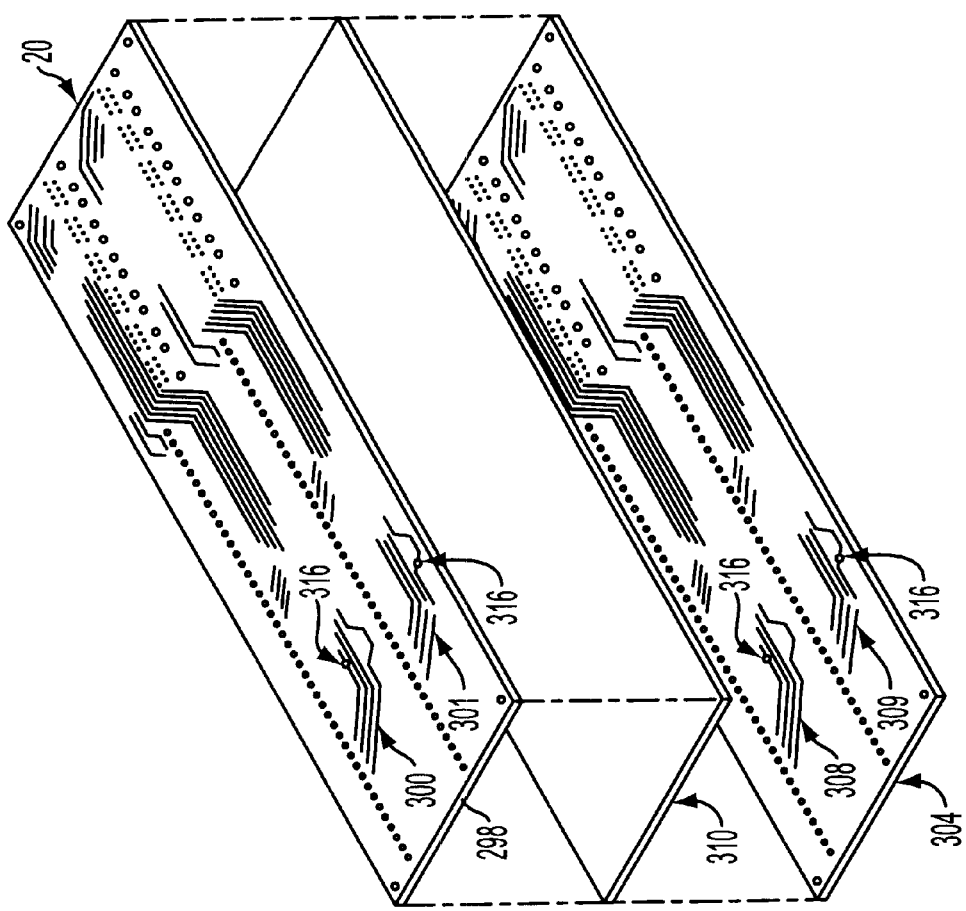
FIG. 4 is an exploded view of the compensating traces of FIG. 2.

Referring now to FIG. 4, printed circuit board 20 provides an electric circuit for connecting the connectors 16 to the jacks 18. The board 20 includes an insulator sheet 298 with compensator trace patterns 300 and 301. Insulator sheet 298 can be formed of, for instance, glass or resin. Further, insulator sheet 298 has a thickness of about 0.006–0.008 inches. A lower insulator sheet 304, having the same thickness and material composition as sheet 298, has identically oriented compensator trace patterns 308 and 309.

An insulator sheet 310, having a thickness of about 0.001–0.003 inches, is positioned between compensator trace patterns 300, 301, 308 and 309. Insulator sheet 310 can be formed of a glass or resin. The individual traces of the compensator trace patterns 300 and 301 are aligned directly and vertically over the respective traces of the second compensator trace patterns 308 and 309. Compensator trace patterns 300 and 301 have all of the traces in a plane which is directly above and parallel to the plane of the compensator trace patterns 308 and 309. The upper trace patterns 300, 301 are spaced apart from the lower trace patterns by the insulator sheet 310.

A hole 316 can be drilled to a desired size in the compensator traces 300, 301, 308, 309 utilizing many differently sized drills depending on the amount of compensation that is desired. Hole 316 can be as small as 0.0019 inches in diameter. Also, the compensation of the PCB can be adjusted in extremely small increments utilizing drills in increments of about 0.0004 inches in diameter. Alternatively, lasers may also be used to adjust the size of the hole 316 as well. Thus, the invention allows for ease of manufacture by allowing electrical measurements while the size of the PCB hole is adjusted. This measurement and/or adjustment can be made at anytime without possibly damaging any components located on the PCB such as circuit traces.

Hence, the PCB has compensator traces that are directly above and parallel to each other. Each of the layers of the PCB contains compensator traces which are aligned in a plane such that each compensator trace is vertically and/or directly above each other. In other words, the compensating traces are aligned in a direction that is perpendicular to the respective planes. Thus, compensation can be effected in each of the various layers of the PCB by drilling one hole for each of the layers since the compensation traces are directly, vertically aligned. According to one aspect of the invention, electrical measurements may be taken during or between adjustments to the hole size, so as to determine the desired hole size to achieve a desired compensation.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A circuit board comprising:
   a first insulative layer containing a fist set of compensating traces in a first plane of said board;
   a second insulative layer containing a second set of compensating traces in a second plane of said board;
   wherein said first compensating traces and said second compensating traces are arranged over one another such that through-holes formed in said first and second insulative layers form identical holes in corresponding compensating traces of said insulative layers.

2. The circuit board of claim 1 further comprising a third insulative layer disposed between said first and second layers.

3. The circuit board of claim 2 wherein said third layer is about 0.001 to about 0.003 inches in thickness.

4. The circuit board of claim 2 wherein said third layer is made of glass.

5. The circuit board of claim 2 wherein said third layer is made of resin.

6. The circuit board of claim 1 wherein said first and second layers are about 0.006 to about 0.008 inches in thickness.

7. The circuit board of claim 1 wherein said first and second layers are made of glass.

8. The circuit board of claim 1 wherein said first and second layers are made of resin.

9. The circuit board of claim 1 wherein said compensating traces have a drilled hole to adjust the compensation.

10. The circuit board of claim 9 wherein said hole is drilled with a laser.

11. The circuit board of claim 9 wherein said hole is drilled in increments of about 0.00004 inches in diameter.

12. The circuit board of claim 9 wherein said hole is no less than about 0.0019 inches in diameter.

13. The circuit board of claim 9 wherein said hole extends through any number of insulative layers to effect compensation.

14. The circuit board of claim 9 wherein said compensation is decreased by increasing the size of said hole.

15. A method of compensating a printed circuit board comprising the acts of:

forming a first insulative layer containing a first set of compensating traces in a first plane of said board;

forming a second insulative layer containing a second set of compensating traces in a second plane of said board;

wherein said first compensating traces and said second compensating traces are arranged above each other; and adjusting the compensation in each of said first and second insulative layers by drilling at least one hole through said layers, wherein said at least one hole penetrates corresponding compensating traces in said insulative layers.

16. The method of claim 15 wherein said hole is drilled in increments of about 0.00004 inches in diameter.

17. The method of claim 15 wherein said hole is no less than about 0.0019 inches in diameter.

18. The method of claim 15 further comprising the act of drilling said hole through any number of insulative layers to effect compensation.

19. The method of claim 15 wherein said compensation is decreased by increasing the size of said hole.

20. The method of claim 15 wherein said hole is drilled to be larger until a desired hole size is determined for a desired compensation.

21. The method of claim 15 further comprising forming a third insulative layer between said first and second layers.

22. The method of claim 21 wherein said third layer is formed to be about 0.001 to about 0.003 inches in thickness.

23. The method of claim 21 wherein said third layer is made of glass.

24. The method of claim 21 wherein said third layer is made of resin.

25. The method of claim 15 wherein said first and second layers are formed to be about 0.006 to about 0.008 inches in thickness.

26. The method of claim 15 wherein said first and second layers are made of glass.

27. The method of claim 15 wherein said first and second layers are made of resin.

* * * * *